United States Patent
Onomura et al.

(10) Patent No.: US 7,862,657 B2
(45) Date of Patent: Jan. 4, 2011

(54) CRYSTAL GROWTH METHOD AND APPARATUS

(75) Inventors: Masaaki Onomura, Tokyo (JP);
Yoshiyuki Harada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 482 days.

(21) Appl. No.: 11/782,052

(22) Filed: Jul. 24, 2007

(65) Prior Publication Data

US 2008/0017099 A1    Jan. 24, 2008

(30) Foreign Application Priority Data

Jul. 24, 2006    (JP)    ............... 2006-201369

(51) Int. Cl.
*C30B 35/00*    (2006.01)
*C23C 16/54*    (2006.01)

(52) U.S. Cl. ............. 117/200; 117/84; 117/88; 117/98; 117/107; 118/715; 118/719; 118/724; 118/725

(58) Field of Classification Search ............ 118/715, 118/719, 724, 725; 117/200, 84, 98, 107
See application file for complete search history.

(56) References Cited

U.S. PATENT DOCUMENTS

| | | | | |
|---|---|---|---|---|
| 6,090,211 | A * | 7/2000 | Kamei et al. | 118/725 |
| 6,108,491 | A * | 8/2000 | Anderson | 392/418 |
| 6,656,284 | B1 * | 12/2003 | Hwang et al. | 118/715 |
| 6,837,940 | B2 | 1/2005 | Komeno et al. | |
| 2004/0060518 | A1 * | 4/2004 | Nakamura et al. | 118/724 |
| 2005/0000406 | A1 * | 1/2005 | Janzen et al. | 117/81 |
| 2005/0181627 | A1 * | 8/2005 | Kamata et al. | 438/778 |

FOREIGN PATENT DOCUMENTS

JP    2003-257867    9/2003

* cited by examiner

*Primary Examiner*—Matthew J Song
(74) *Attorney, Agent, or Firm*—Turocy & Watson, LLP

(57) ABSTRACT

A crystal growth method for forming a semiconductor film, the method includes: while revolving one or more substrates about a rotation axis, passing raw material gas and carrier gas from the rotation axis side in a direction substantially parallel to a major surface of the substrate. The center of the substrate is located on a side nearer to the rotation axis than a position at which growth rate of the semiconductor film formed by thermal decomposition of the raw material gas is maximized.

10 Claims, 7 Drawing Sheets

RADIAL DISTANCE R FROM ROTATION AXIS

CRYSTAL GROWTH METHOD AND APPARATUS

CROSS-REFERENCE TO RELATED APPLICATIONS

This application is based upon and claims the benefit of priority from the prior Japanese Patent Application No. 2006-201369, filed on Jul. 24, 2006; the entire contents of which are incorporated herein by reference.

BACKGROUND OF THE INVENTION

1. Field of the Invention

This invention relates to a crystal growth method and apparatus.

2. Background Art

Metal-organic chemical vapor deposition (MOCVD) is used for crystal growth of compound semiconductors because of its good controllability on film thickness and composition. However, growth of nitride semiconductors such as GaN requires higher crystal growth temperature than that of AlGaAs-based and InAlGaP-based materials, hence causing various problems.

For example, in the so-called horizontal flow scheme where a wafer is held nearly horizontal and the flow direction of raw material gas and carrier gas is nearly parallel to the wafer, the gas is emitted from a nozzle located in the vicinity of the center of the crystal growth chamber. In this case, the gas temperature cannot be sufficiently decreased on the upstream side, resulting in thermal decomposition of the gas and its associated intermediate reaction. Consequently, the raw material element tends to run short in the vicinity of the wafer, and the semiconductor film growth rate often becomes lower than its maximum.

In particular, as a result of intermediate reaction associated with the decomposition of trimethylaluminum and ammonia, aluminum (Al) runs short on the downstream side. Thus, unfortunately, it is difficult to increase the Al composition ratio.

JP 2003-257867A discloses a technique for improving uniformity and controllability of crystal growth film across a wafer. This technique is directed to improving uniformity of electron mobility in AlGaAs-based or other materials by controlling the temperature of the region from the center of the susceptor to the wafer to be lower than that on the substrate. However, further improvement is needed for nitride materials because of their higher crystal growth temperature.

SUMMARY OF THE INVENTION

According to an aspect of the invention, there is provided a crystal growth method for forming a semiconductor film, the method including: while revolving one or more substrates about a rotation axis, passing raw material gas and carrier gas from the rotation axis side in a direction substantially parallel to a major surface of the substrate, the center of the substrate being located on a side nearer to the rotation axis than a position at which growth rate of the semiconductor film formed by thermal decomposition of the raw material gas is maximized.

According to another aspect of the invention, there is provided a crystal growth apparatus including: a rotary shaft; a susceptor having a substrate mounting portion interlocking with the rotary shaft, the susceptor revolving a substrate mounted on the substrate mounting portion about a rotation axis of the rotary shaft; a heater configured to heat the substrate mounted on the susceptor; a nozzle configured to emit raw material gas from the rotation axis side in a direction substantially parallel to a major surface of the substrate; and a first heat blocking part provided between the susceptor and the rotary shaft.

BRIEF DESCRIPTION OF THE DRAWINGS

FIG. 1 is a schematic view for illustrating a crystal growth method according to the embodiment of the invention.

FIG. 2 is a graph illustrating the supply ratio of Al raw material of the dependence of the Al composition ratio.

FIG. 5 shows a nozzle using a crystal growth apparatus of an embodiment of the invention.

FIG. 6 shows a variation of the nozzle using a crystal growth apparatus of an embodiment of the invention.

FIG. 7 shows a second variation of the nozzle, using a crystal growth apparatus of an embodiment of the invention.

DETAILED DESCRIPTION OF THE INVENTION

An embodiment of the invention will now be described with reference to the drawings.

Figure 1A:
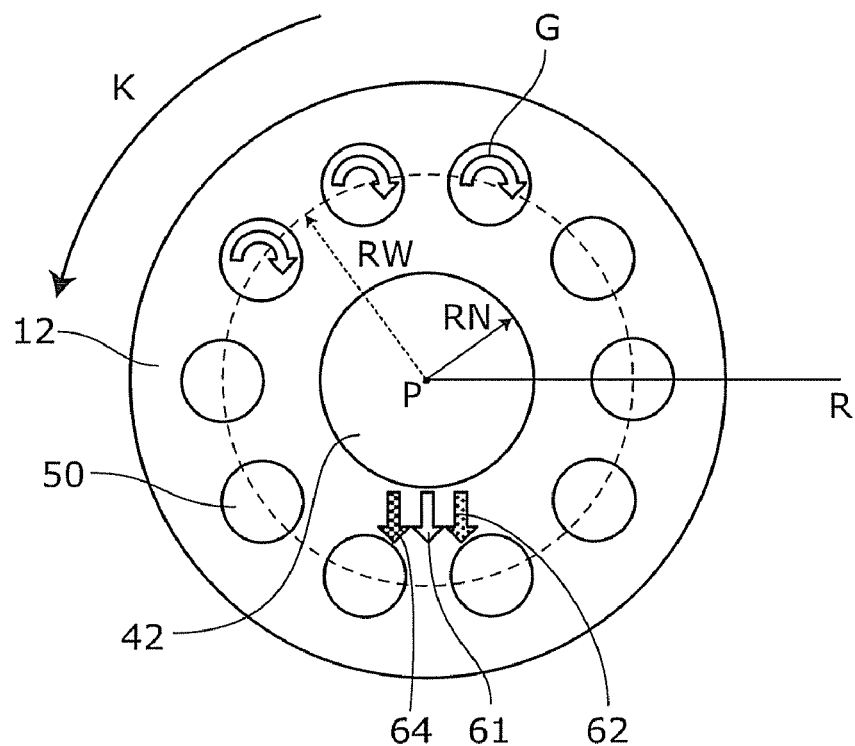
FIG. 1A is a schematic plan view of a susceptor.
Figure 1B:
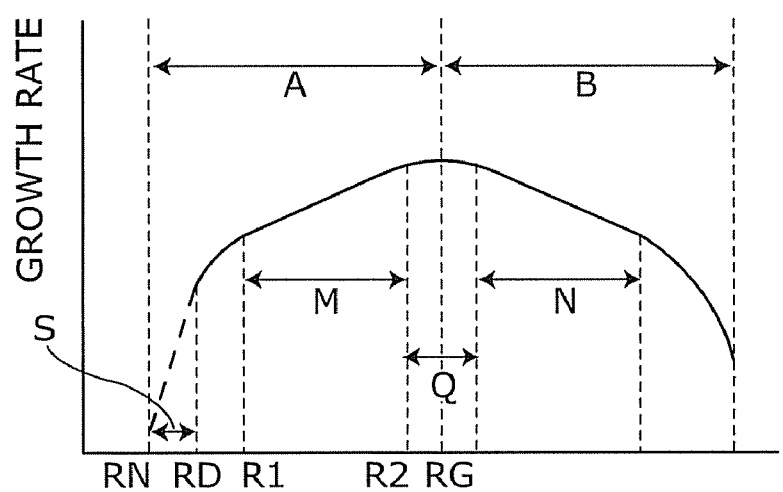
FIG. 1B is a graph showing the dependence of the radial distribution of the growth rate.

FIG. 1 is a schematic view for illustrating a crystal growth method according to the embodiment of the invention. More specifically, FIG. 1A is a schematic plan view of a susceptor 12 holding a plurality of substrates 50 in a crystal growth apparatus, and FIG. 1B is a graph showing the radial distribution of the growth rate of semiconductor film from the center of the susceptor.

In a horizontal flow MOCVD apparatus for crystal growth of compound semiconductors, a susceptor 12 with a plurality of substrates 50 placed thereon is rotated about a rotation axis for improving uniformity of crystal growth film. More specifically, as illustrated in FIG. 1A, a plurality of substrates 50 made of semiconductor material are mounted on the susceptor 12. The susceptor 12 rotates in the direction of arrow K (or opposite thereto) about point P, the rotation center. Hence each substrate 50 revolves about the point P.

On the other hand, the nozzle 42 is fixed. Raw material gas and carrier gas are issued out in the radial direction R and nearly parallel to the major surface of the substrate 50 from the outlet of the nozzle 42 located at a radial distance RN. In FIG. 1A, gas flow in only one direction is shown.

By the revolution of the substrate 50, the circumferential distribution of the gas flow from the nozzle 42 and of the temperature of the susceptor 12 can be averaged, and the circumferential variation of film thickness and characteristics can be reduced. In order to achieve uniform thickness and characteristics among semiconductor films formed by crystal growth on the plurality of substrates 50, the centers of the substrates 50 are radially located nearly equidistant from the point P, that is, at a distance RW. Furthermore, by rotating each of the substrates 50 on its axis in the direction of arrow G (or opposite thereto), the film thickness and characteristics can be made uniform across the substrate.

When the substrates 50 are heated by a heater, the raw material gas supplied by the horizontal flow is thermally decomposed, and semiconductor film is grown above the crystal growth temperature. Here, the growth rate of the semiconductor film is substantially determined by temperature distribution in the susceptor 12 and the distribution of the supplied amount of the raw material gas.

In FIG. 1B, the solid line representing the growth rate includes regions A and B. The region A is a region on the near side of position RG at which the growth rate is maximized, near to the rotation axis, where the growth rate increases with the increase of radial distance R. The region B is a region outside the position RG, where the growth rate decreases with the increase of distance R. Here, the region A represents a region where the supply of growth raw material increases with the radial distance, and the region B represents a region where the supply of growth raw material decreases with the radial distance. The growth rate increases substantially linearly in the region M of $R1 \leq R \leq R2$, is saturated to its maximum at RG in the region Q, and decreases substantially linearly in the region N. On the rotation axis side of the region M and outside the region N, the growth rate decreases relatively steeply. In this embodiment, crystal growth is performed so that the center RW of the substrate 50 is located on the rotation axis side of the position RG at which the growth rate of semiconductor film is maximized.

Conversely, if crystal growth is performed so that the center RW of the substrate 50 is located outside the position RG of maximum growth rate, deposits of growth film deposited on the susceptor 12 and inside the crystal growth apparatus increase on the gas upstream side of the substrate 50, that is, near the rotation axis of the susceptor 12. If the deposits are decomposed or detached and reattached to the substrate 50, pitting and roughness occur on the surface of the growth film and degrades the quality and characteristics of the growth film.

In contrast, in this embodiment, the center RW of the substrate 50 is located on the side nearer to the rotation axis than the position RG. Thus deposits inside the crystal growth apparatus on the gas upstream side of the substrate 50 can be decreased. Hence pitting and roughness can be reduced, and the quality and characteristics of growth film can be improved.

Furthermore, when the substrate 50 is rotated on its axis with its near entirety located in the region M illustrated in FIG. 1B, the radial variation of growth rate can be averaged to further enhance the uniformity of growth film. That is, because the growth rate has a nearly linear distribution in the region M, the distribution of thickness and characteristics of growth film can be made uniform by rotating the substrate 50 on its axis in the region M.

As a method for crystal growth by placing the center of the substrate 50 within the region A of the growth rate curve illustrated in FIG. 1B, it is possible to use the method of increasing the total flow rate of raw material gas. Then the region A can be extended to shift the position RG of maximum growth rate to the downstream side of gas flow.

It is also possible to use the method of decreasing the temperature on the upstream side. By decreasing the temperature on the upstream side, thermal decomposition of raw material gas can be reduced on the upstream side. Hence it is possible to shift the position RG of maximum growth rate to the gas downstream side, thereby extending the region A.

In addition to the effect of improving the quality and uniformity of growth film, this embodiment can also achieve the effects of reducing raw material gas, increasing mixed crystal ratio, and increasing dopant concentration.

That is, the center RW of the substrate 50 is located on the side nearer to the rotation axis than the position RG. Thus thermal decomposition and intermediate reaction of raw material gas can be reduced on the upstream side of the substrate. Hence attachment of deposits to this portion can be prevented, and waste of raw material gas can be reduced.

Next, the effect of achieving higher aluminum (Al) composition ratio is illustrated with reference to nitride semiconductor materials.

Figure 2A:
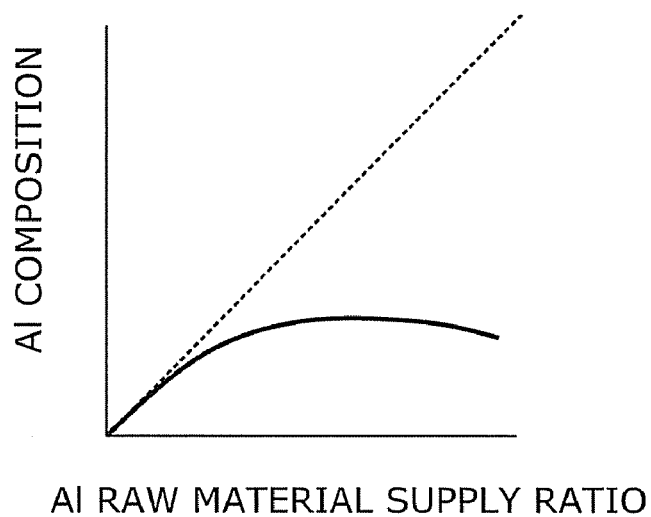
FIG. 2A shows a comparative example.
Figure 2B:
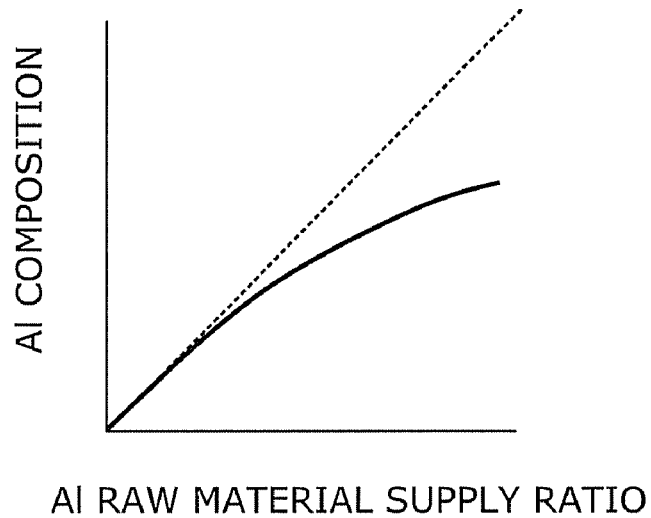
FIG. 2B shows an embodiment of the invention.

FIG. 2 is a graph illustrating the dependence of the Al composition ratio of growth film on the supply ratio of Al raw material. More specifically, FIG. 2A shows a comparative example of crystal growth in the region B where the growth rate decreases with radial distance R, and FIG. 2B shows an example of growth in the region A illustrated in FIG. 1B.

In the comparative example, because violent intermediate reaction of Al raw material with other raw materials occurs before deposition species reach the substrate, the Al element is depleted in the vicinity of the substrate. Thus the Al composition ratio is not proportional to the Al raw material supply ratio, but saturated. This tendency is pronounced presumably because Al is more reactive than Ga, for example. If the Al raw material supply ratio is further increased, the Al composition ratio rather decreases. The Al composition ratio decreases also when the pressure in the chamber is increased.

In contrast, growth in the region A as illustrated in FIG. 1B significantly reduces the region where intermediate reaction occurs on the upstream side of the substrate. That is, because the Al raw material element is not depleted, the Al composition ratio of growth film grown on the substrate can be increased with the increase of the Al raw material supply ratio. Consequently, the Al composition ratio can be further increased in InGaAlN and other materials. Here, for preventing intermediate reaction, it is more effective to decrease the temperature in the vicinity of the upstream portion to generally 500° C. or less. The material is not limited to nitride semiconductor materials, but a similar effect is also achieved for InGaAlP-based and AlGaAs-based materials.

Next, again with reference to nitride semiconductor materials, a description is given of InGaAlN or other material being doped with magnesium (Mg), a p-type dopant.

In the case of crystal growth in the region B where the growth rate decreases in the radial direction R, as with the case described above with reference to FIG. 2, Mg concentration in the growth film is not proportional to the flow rate of Mg raw material such as $Cp_2Mg$, but saturated. This is presumably because Mg is consumed and depleted by intermediate reaction on the upstream side of the substrate. The Mg concentration significantly decreases also when the pressure in the chamber is increased.

In contrast, growth in the region A illustrated in FIG. 1B can significantly reduce the region where intermediate reaction occurs on the upstream side of the substrate. Consequently, because Mg is not depleted, the Mg concentration in the growth film can be increased with the increase of Mg raw material gas flow rate. Hence the Mg concentration can be further increased in InGaAlN or other material.

In this embodiment, when the temperature on the upstream side of the substrate is decreased to steeply decrease the growth rate in the region S of RN<R<RD in the region A shown in FIG. 1B, the effects described above can be further enhanced. That is, by decreasing the temperature on the upstream side of the substrate, decomposition and intermediate reaction of raw material gas in that portion can be further reduced. Consequently, it is possible to further enhance the above effects of improving the quality of growth film, reducing raw material gas, improving mixed crystal ratio, and increasing dopant concentration.

Next, a crystal growth apparatus for realizing the crystal growth method according to this embodiment is described.

Figure 3:
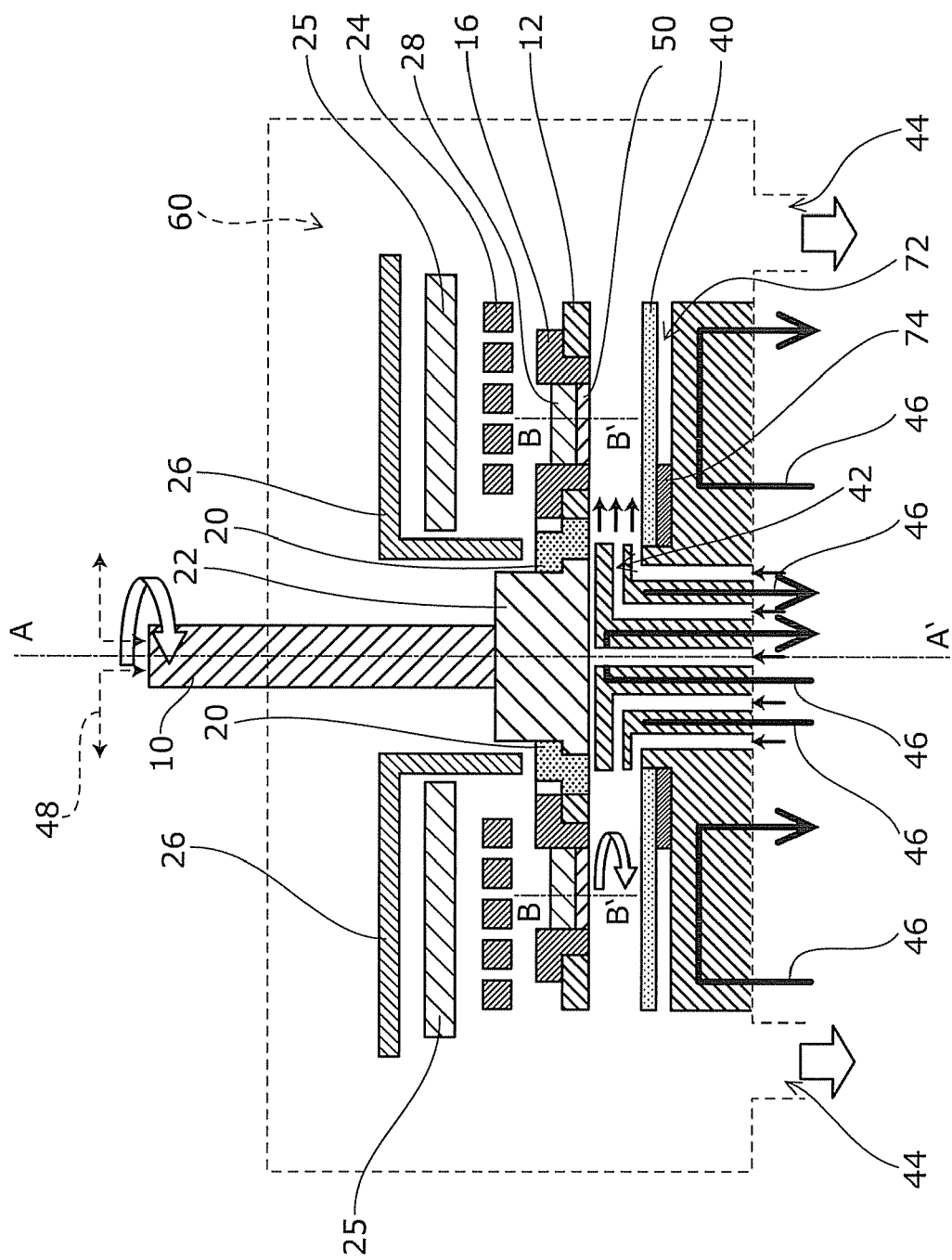
FIG. 3 is a schematic cross-sectional view of a crystal growth apparatus according to the embodiment of the invention.

FIG. 3 is a schematic cross-sectional view of a crystal growth apparatus according to the embodiment of the invention. In this figure, the same elements as those described above with reference to FIG. 1 are marked with like reference numerals.

A vacuum chamber 60 includes a nozzle 42 made of SUS having a channel for cooling water 46, an annular counterplate 40 made of quartz surrounding the lower portion of the nozzle 42, a heater 24, a heater cover 25 made of carbon, and a reflector 26. The vacuum chamber 60 further includes an exhaust port 44 for exhausting raw material gas and carrier gas remaining after reaction. The nozzle 42 has a plurality of outlets for issuing group-III raw material gas, group-V raw material gas, carrier gas, or mixed gas thereof. The shape of the nozzle 42 will be described later with reference to examples.

A rotary shaft 10 is provided above the nozzle 42, and a disk-shaped susceptor 12 is attached to the rotary shaft 10. The susceptor 12 is made of carbon covered with silicon carbide (SiC) and includes substrate mounting portions, each having an opening adapted to the shape of substrate. Carbon is suitable as susceptor material because it has good workability and wide temperature range up to 3000° C. The susceptor 12 is coupled to the rotary shaft 10 via a heat insulating member (first heat blocking part) 20 and a heat conducting member 22, and rotated while interlocking with these members. The heat insulating member 20 is made of quartz having low thermal conductivity. On the other hand, the heat conducting member 22 has higher thermal conductivity than carbon forming the susceptor, and is made of a compound such as boron nitride (BN) or a metal such as inconel.

A flow channel (not shown) for passing gas or liquid coolant 48 is suitably provided inside the rotary shaft 10. The rotation axis AA', which is the center line of the rotary shaft 10, substantially matches the center line of the nozzle 42.

By rotating the susceptor 12 about the rotation axis AA', circumferential variation of the distribution of gas flow and/or temperature, if any, can be made uniform. Furthermore, the substrate 50 is rotated on its axis about BB' (see FIG. 3) as indicated by arrow G in FIG. 1A for averaging the variation of growth rate in the radial direction R to form uniform film. To this end, for example, it is suitable to rotate a substrate holder 16 made of BN by gears (not shown). Moreover, a heat spreader 28 made of SiC-coated carbon can be placed above the substrate 50 with a gap of e.g. less than 1 mm to make the substrate temperature more uniform. Here, as illustrated in FIG. 3, the substrate 50 can be placed face-down to prevent dust and/or foreign matter from falling on the surface of the substrate 50 in the vacuum chamber 60.

In the crystal growth apparatus of this example, the temperature increase in the vicinity of the nozzle 42 can be restricted. More specifically, the heat conducting member 22 is attached to the rotary shaft 10 provided above the nozzle 42. The heat insulating member 20 is provided between the heat conducting member 22 and the substrate mounting portion. Consequently, heat transfer from the substrate holder 16 to the heat conducting member 22 can be blocked. Furthermore, the rotary shaft 10 is cooled by the coolant 48, and hence the heat conducting member 22 provided at the tip of the rotary shaft 10 can also be kept at a low temperature. Moreover, thermal conduction by gas and radiation indirectly cool the nozzle 42 via the heat conducting member 22. Thus the temperature profile in the region from the outlet of the nozzle 42 to the substrate 50 can be made steep. Consequently, thermal decomposition and intermediate reaction of raw material gas on the upstream side of the substrate 50 can be effectively prevented. That is, the growth rate can be steeply decreased from the position RD toward the position RN, as in the region S shown in FIG. 1B.

The heat insulating effect of the heat insulating member 20 can be enhanced by increasing its length along the radial direction R. Hence its shape can be suitably determined by taking into consideration the outer diameter of the susceptor 12. Because the nozzle 42 can be cooled by cooling water 46 and carrier gas, the cooling effect in the region on the upstream side of the substrate can be further increased by decreasing the spacing between the nozzle 42 and the susceptor 12 to e.g. about 1 mm. Here, the cooling systems for the nozzle 42 and for the portion below the counterplate 40 can be made independent, and temperature control can be performed separately in each region.

On the other hand, the heater 24 needs to have high heat generation for heating the substrate 50 to the crystal growth temperature. For blocking the resulting radiant heat, it is more preferable to place the reflector (second heat blocking part) 26 between the heater 24, and the rotary shaft 10 and the heat conducting member 22. The reflector 26 can be formed by coating an alloy material such as inconel with a material with low thermal conductivity and further providing a gold plating layer on the surface thereof. The gold plating layer is preferable because it has a reflectivity of as high as 98.2% to infrared radiation at a wavelength of 1000 nm and chemically stable at high temperatures.

Figure 4:
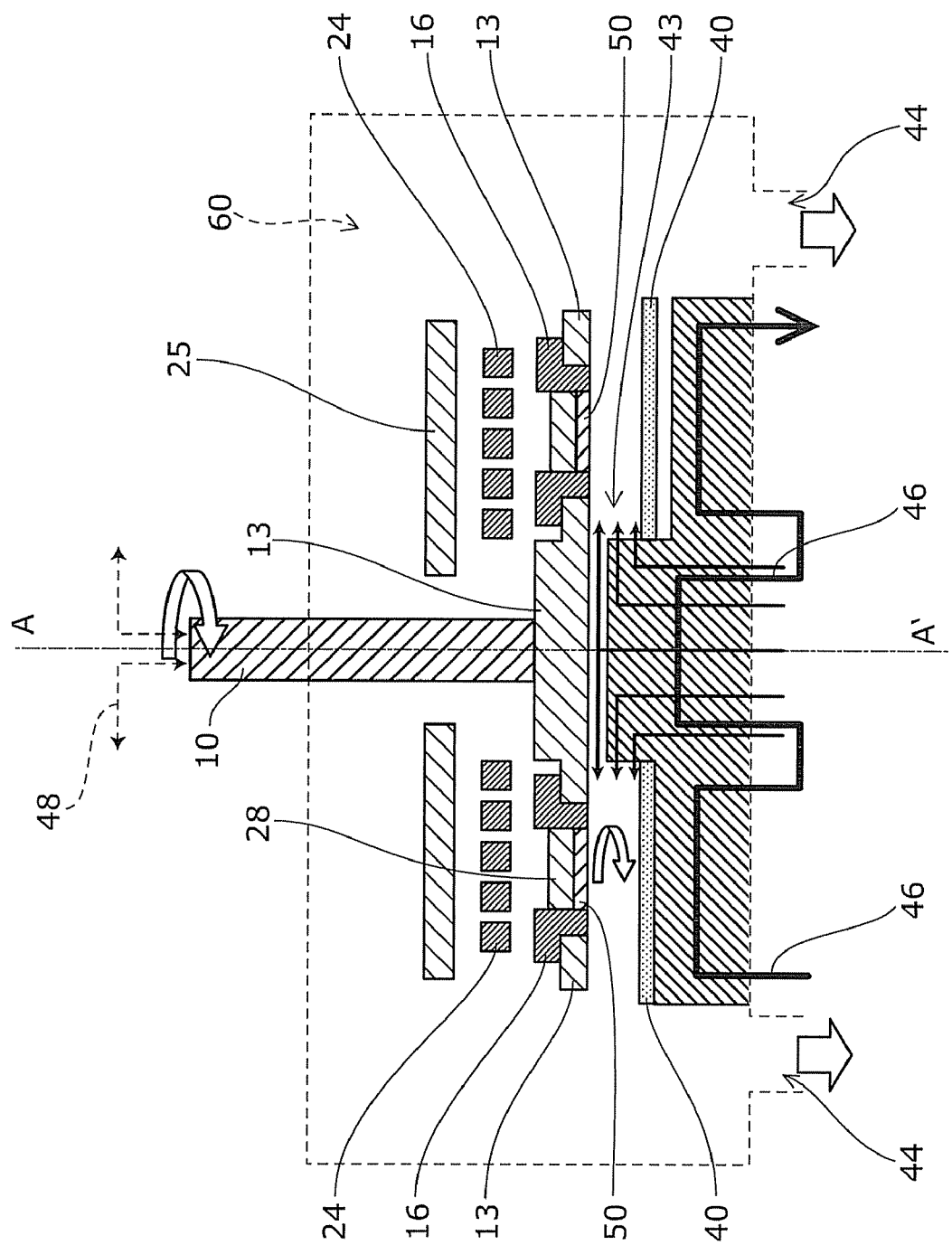
FIG. 4 is a schematic cross-sectional view of a crystal growth apparatus of the comparative example.

FIG. 4 is a schematic cross-sectional view of a crystal growth apparatus of the comparative example. The same elements as those in FIG. 3 are marked with like reference numerals and not described in detail.

Also in this comparative example, the vacuum chamber 60 includes a susceptor 13 made of SiC-coated carbon, which has substrate holders 16 for attaching substrates 50 and is rotatably coupled to the rotary shaft 10. However, this comparative example does not include the heat insulating member 20, the heat conducting member 22, and the reflector 26 described above with reference to FIG. 3.

In this comparative example, heat emitted from the heater 24 is conducted to the center of the susceptor 13 made of carbon and increases temperature in the vicinity of the gas nozzle 43. Temperature at the center of the rotary shaft 10 and the susceptor 13 is increased also by directly receiving radiant heat from the heater 24.

Consequently, temperature increases in the region between RN (FIG. 1B), where the outlet of the nozzle 43 is located, and the end of the substrate 50 on the center line AA' side. In this region, organometallic gas containing group-III element and ammonia gas containing group-V element start decomposition and intermediate reaction. This shifts the position RG of maximum crystal growth rate close to the rotation axis (center line AA').

In contrast, in the example shown in FIG. 3, by restricting temperature increase in the portion on the upstream side of the substrate 50, thermal decomposition and intermediate reaction of raw material gas is prevented in this portion, and the position RG of maximum crystal growth rate can be shifted away from the rotation axis (center line AA'). Consequently, the center RW of the substrate 50 can be located on the side nearer to the rotation axis than the position RG. Thus, as described above, it is possible to achieve the effects of improving the quality of growth film, reducing raw material gas, improving mixed crystal ratio, and increasing dopant concentration.

Next, returning to FIG. 3, the cooling structure in the vicinity of the counterplate 40 is described. The fixed part of the crystal growth apparatus including the nozzle 42 is cooled by cooling water 46. If the counterplate 40 opposed to the susceptor 12 is excessively cooled, difference from the growth temperature increases, thereby increasing deposits on the counterplate 40 and depleting ammonia reaction species.

Hence, it is preferable to provide a gap 72 or heat insulator below the counterplate 40 or to interpose an annular molybdenum plate 74 having a suitable length along the radial direction R, thereby reducing deposits on the counterplate 40 and preventing depletion of ammonia reaction species.

Next, the nozzle 42 operable with the crystal growth apparatus of this embodiment is described.

Figure 5A:
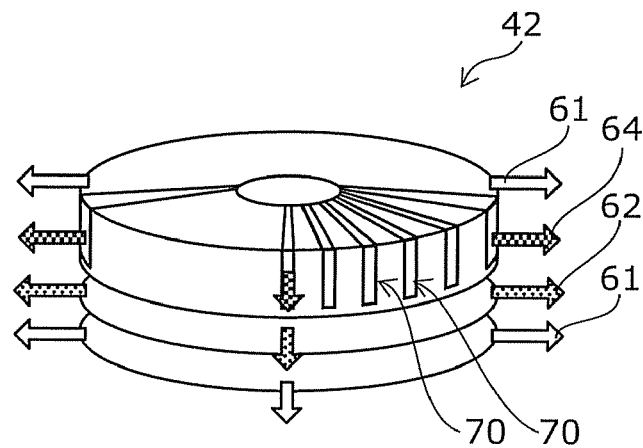
FIG. 5A is a schematic perspective view of the nozzle.
Figure 5B:
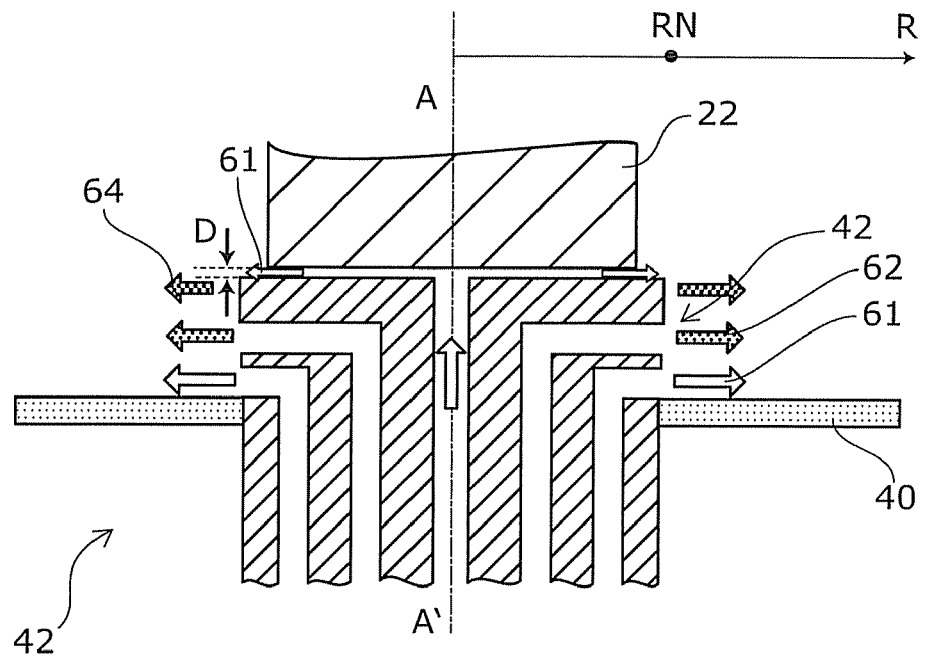
FIG. 5B is a schematic cross-sectional view thereof.

FIG. 5A is a schematic perspective view of the nozzle 42, and FIG. 5B is a schematic cross-sectional view thereof.

The nozzle 42 includes channels for carrier gas, for mixed gas of group-III gas and carrier gas, and for mixed gas of group-V gas and carrier gas, and has respective outlets at the position R=RN. The nozzle 42 further includes a flow channel for cooling water 46 as illustrated in FIG. 3. The gap D between the upper face of the nozzle 42 and the lower face of the heat conducting member 22 can be set to as small as e.g. 1 mm to further decrease temperature in the vicinity of the nozzle outlets with the help of radiation and thermal conduction to the heat conducting member 22.

The heat conducting member 22 is further cooled by emitting carrier gas 61 upward from the gas channel along the center line AA' of the nozzle 42. Furthermore, the upper portion of the nozzle 42, in the closest proximity of the susceptor 12, has vertically cut slits 70 at nearly equiangular spacing, through which mixed gas of group-V gas, which is ammonia, and carrier gas are issued laterally. Moreover, by reducing the gap D between the upper face of the nozzle 42 and the lower face of the heat conducting member 22, the flow rate of issued group-V gas can be adequately controlled, and the group-V and group-III raw material gases can be mixed more uniformly. Issuing ammonia, which is the group-V gas, from the upper side facilitates decomposition of ammonia, allowing ammonia reaction species to easily reach the substrate.

Figure 6A:
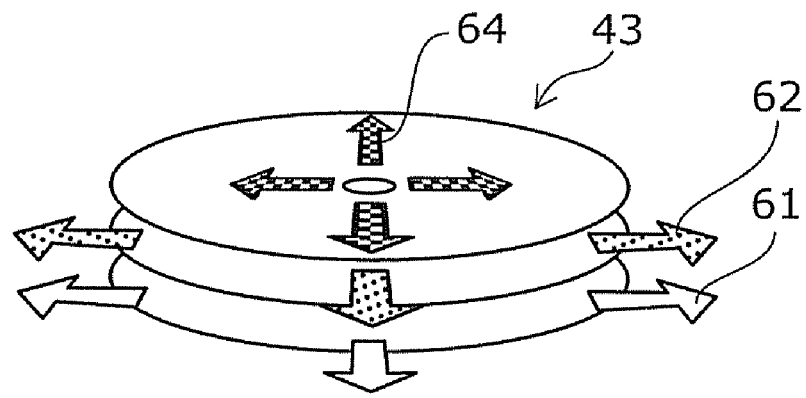
FIG. 6A is a schematic perspective view of the variation of nozzle.
Figure 6B:
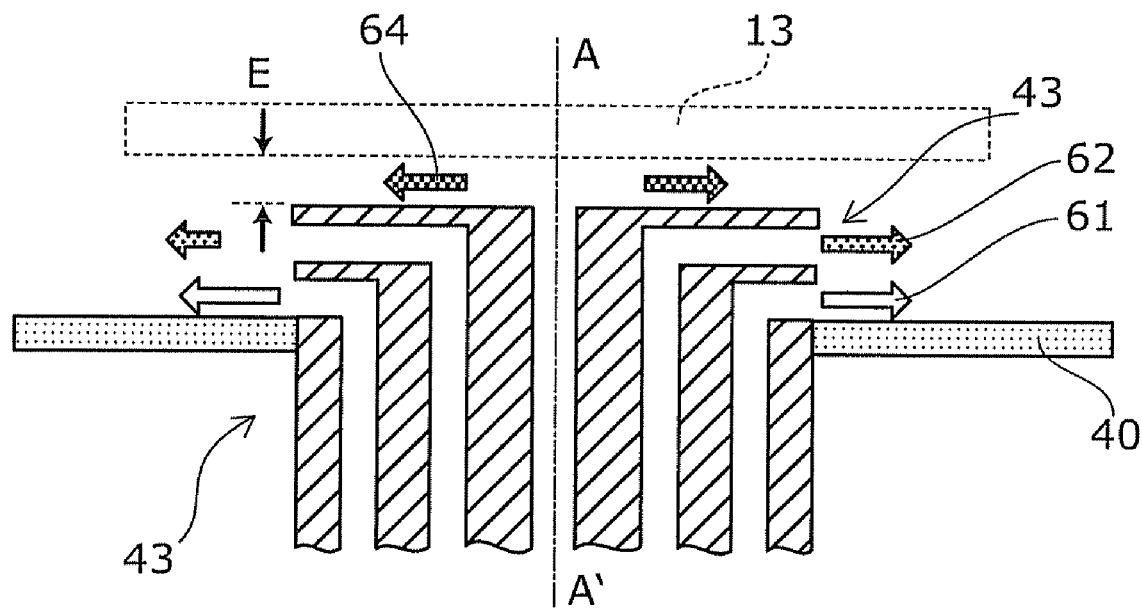
FIG. 6B is a schematic cross-sectional view thereof.

FIG. 6 shows a variation of the nozzle 43, where FIG. 6A is a schematic perspective view thereof and FIG. 6B is a schematic cross-sectional view thereof.

This variation includes no slits 70. It is also possible to use this type of nozzle 43.

Figure 7A:
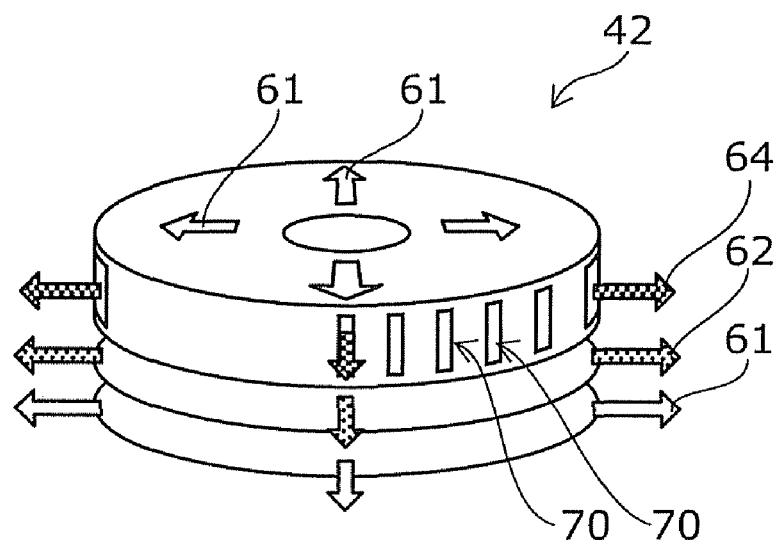
FIG. 7A is a schematic perspective view thereof and FIG. 7B is a schematic cross-sectional view thereof.
Figure 7B:
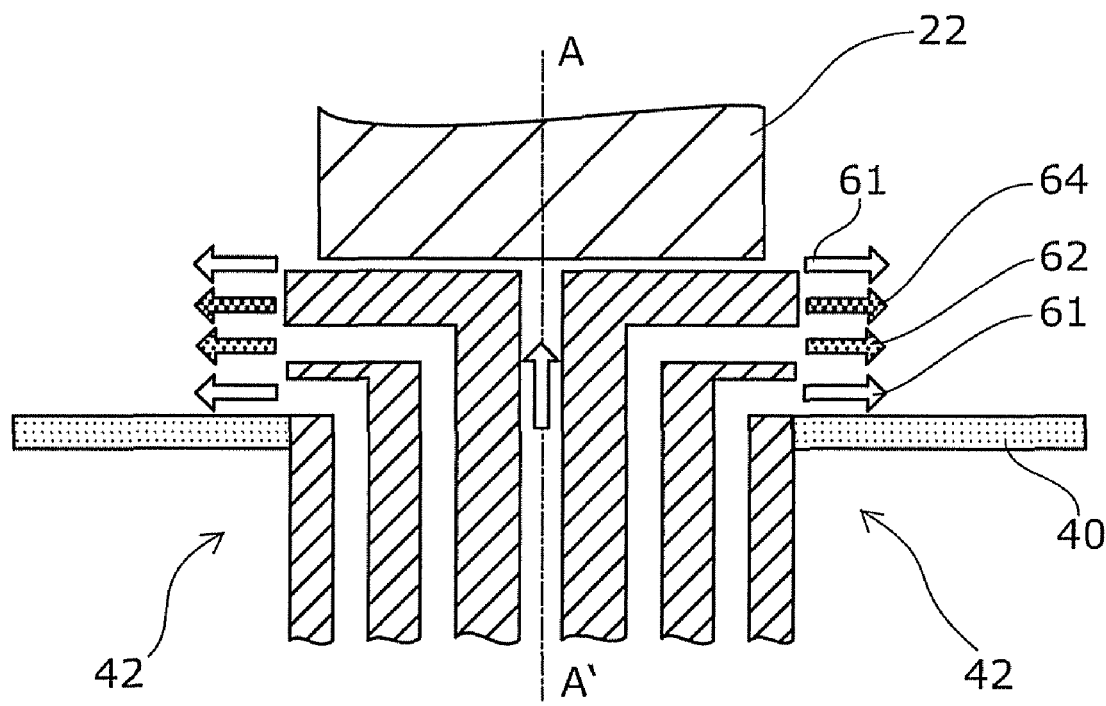

FIG. 7 shows a second variation of the nozzle 42, where FIG. 7A is a schematic perspective view thereof and FIG. 7B is a schematic cross-sectional view thereof.

In this variation, the slit 70 has an opening directed to the lateral side of the nozzle 42. Thus group-V gas is not directly in contact with the heat conducting member 22 being at high temperature. Hence decomposition of raw material gas can be reduced. Furthermore, by issuing hydrogen or other carrier gas 60 upward from the nozzle 42 toward the heat conducting member 22, it is possible to further cool the heat conducting member 22.

As described above, in the crystal growth method and apparatus of this embodiment, growth is performed primarily in the region A of increasing growth rate. Consequently, deposits in the chamber can be reduced, and degradation in the quality and characteristics of growth film due to reattachment of deposits can be prevented. Furthermore, by preventing decomposition and intermediate reaction of raw material gas on the upstream side of the substrate, depletion of the raw material element can be prevented, and thereby it is possible to obtain Al mixed crystal with increased Al composition ratio and nitride semiconductor devices with increased Mg doping concentration. Moreover, thermal decomposition of raw material gas not contributing to crystal growth can be reduced, and hence utilization efficiency of materials can be improved.

The embodiment of the invention has been described with reference to examples. However, the invention is not limited to these examples. For instance, the susceptor, substrate holder, counterplate, reflector, heat insulating member, heat conducting member, heat spreader, and other elements constituting the crystal growth apparatus that are variously adapted by those skilled in the art are also encompassed within the scope of the invention as long as they include the features of the invention.

The invention claimed is:

1. A crystal growth apparatus comprising:
a rotary shaft;
a susceptor having a substrate mounting portion interlocking with the rotary shaft, the susceptor revolving a substrate mounted on the substrate mounting portion about a rotation axis of the rotary shaft;
a heater configured to heat the substrate mounted on the susceptor;
a nozzle configured to emit raw material gas from the rotation axis side in a direction substantially parallel to a major surface of the substrate;
a heat conducting member having a thermal conductivity higher than that of the susceptor, the heat conductive member being coupled to the rotary shaft;
a first heat blocking part made of heat insulating material and coupled to the heat conducting member on an inner edge side of the first heat blocking part and to the susceptor on an outer edge side of the first heat blocking part; and
a second heat blocking part having an infrared reflecting layer and provided in a space between the heater and the rotary shaft.

2. The crystal growth apparatus according to claim 1, wherein the nozzle further includes an opening for emitting gas toward the rotary shaft.

3. The crystal growth apparatus according to claim 1, wherein the substrate is rotated on its axis.

4. The crystal growth apparatus according to claim 1, wherein the rotary shaft is cooled by a coolant.

5. The crystal growth apparatus according to claim 1, wherein the nozzle is cooled by a coolant.

6. The crystal growth apparatus according to claim 1, wherein the heat insulating material includes quartz.

7. The crystal growth apparatus according to claim 1, wherein the infrared reflecting layer includes an Au layer.

8. The crystal growth apparatus according to claim 1, wherein the susceptor includes carbon.

9. The crystal growth apparatus according to claim 8, wherein the heat conducting member includes boron nitride or inconel.

10. The crystal growth apparatus according to claim 1, further comprising:
a counterplate, which is opposed to the susceptor and below which one of a gap, a heat insulating member, and an annular molybdenum plate is provided.

* * * * *